(12) United States Patent
Yu et al.

(10) Patent No.: US 10,524,349 B2
(45) Date of Patent: Dec. 31, 2019

(54) PRINTED CIRCUIT BOARD WITH BUILT-IN VERTICAL HEAT DISSIPATION CERAMIC BLOCK, AND ELECTRICAL ASSEMBLY COMPRISING THE BOARD

(71) Applicants: ICP Technology Co., Ltd., Taoyuan (TW); Xiamen Sentecee E&E Co., Ltd., Xiamen (CN)

(72) Inventors: Ho-Chieh Yu, Taoyuan (TW); Cheng-Lung Liao, Taoyuan (TW); Chun-Yu Lin, Taoyuan (TW); Jason An-Cheng Huang, Taoyuan (TW)

(73) Assignees: ICP Technology Co., Ltd., Taoyuan (TW); Xiamen Sentecee E&E Co., Ltd., Xiamen (CN)

( * ) Notice: Subject to any disclaimer, the term of this patent is extended or adjusted under 35 U.S.C. 154(b) by 0 days.

(21) Appl. No.: 15/995,756

(22) Filed: Jun. 1, 2018

(65) Prior Publication Data

US 2018/0352646 A1    Dec. 6, 2018

(30) Foreign Application Priority Data

Jun. 1, 2017  (CN) .......................... 2017 1 0403197
Apr. 3, 2018  (CN) .......................... 2018 1 0288466

(51) Int. Cl.
*H05K 1/02*         (2006.01)
*H05K 1/03*         (2006.01)
(Continued)

(52) U.S. Cl.
CPC ....... *H05K 1/0204* (2013.01); *H01L 23/3677* (2013.01); *H01L 23/3731* (2013.01);
(Continued)

(58) Field of Classification Search
CPC ............. H01L 2924/00; H01L 2224/97; H01L 2224/32145; H01L 2224/16225;
(Continued)

(56) References Cited

U.S. PATENT DOCUMENTS

2008/0237836 A1* 10/2008 Chia ...................... H01L 21/568
                                                              257/698
2011/0156082 A1*  6/2011 Yu .......................... H01L 33/641
                                                              257/99

(Continued)

OTHER PUBLICATIONS https://www.doitpoms.ac.uk/tlplib/artefact/classes.php, university of Cambridge (Year: 2004).*

*Primary Examiner* — Mandeep S Buttar
(74) *Attorney, Agent, or Firm* — Wang Law Firm, Inc.

(57) ABSTRACT

A printed circuit board with built-in vertical heat dissipation ceramic block, and an electrical assembly are disclosed. The electrical assembly includes the board and a plurality of electronic components. The printed circuit boards includes a dielectric material layer defining at least one through hole, at least one ceramic block corresponding to the through hole, at least one fixing portion for joining the ceramic block to the through hole of the dielectric material layer, a metal circuit layer provided on upper surfaces of the dielectric material layer and the ceramic block, and a high thermal conductivity layer provided on lower surfaces of the dielectric material layer and the ceramic block. The printed circuit board allows the location and size of the ceramic block to be modified according to requirements, so as to implement complicated circuit designs, achieve good effect of thermal conduction, control thermal conduction path, and reduce manufacturing cost.

7 Claims, 6 Drawing Sheets

(51) Int. Cl.
*H01L 23/373* (2006.01)
*H05K 1/18* (2006.01)
*H01L 23/367* (2006.01)
*F21V 29/76* (2015.01)
*H01L 33/64* (2010.01)
*F21S 8/08* (2006.01)
*F21Y 115/10* (2016.01)
*F21V 29/503* (2015.01)

(52) U.S. Cl.
CPC ........... *H05K 1/0306* (2013.01); *H05K 1/181* (2013.01); *F21S 8/085* (2013.01); *F21V 29/503* (2015.01); *F21V 29/763* (2015.01); *F21Y 2115/10* (2016.08); *H01L 33/641* (2013.01); *H01L 33/647* (2013.01); *H01L 2224/48091* (2013.01); *H01L 2224/73265* (2013.01); *H05K 1/028* (2013.01); *H05K 2201/0187* (2013.01); *H05K 2201/068* (2013.01); *H05K 2201/10106* (2013.01); *H05K 2201/10166* (2013.01); *H05K 2201/10416* (2013.01)

(58) Field of Classification Search
CPC ..... H01L 2224/32245; H01L 23/49822; H01L 24/97; H01L 23/5384; H01L 21/4857; H01L 23/36; H01L 2924/15192; H01L 23/3731; H01L 21/76877; H01L 21/76898; H01L 2224/02331; H01L 2225/06548; H01L 2225/06589; H01L 23/373; H01L 2225/1094
USPC .................. 174/260, 255; 361/301.4, 321.1; 257/E23.062, E21.585, 687, 698, 99; 156/345.53

See application file for complete search history.

(56) References Cited

U.S. PATENT DOCUMENTS

2011/0292614 A1* 12/2011 Horng ................. H01L 23/3677
361/720
2012/0255165 A1* 10/2012 Chang ................. H05K 1/0204
29/829

* cited by examiner

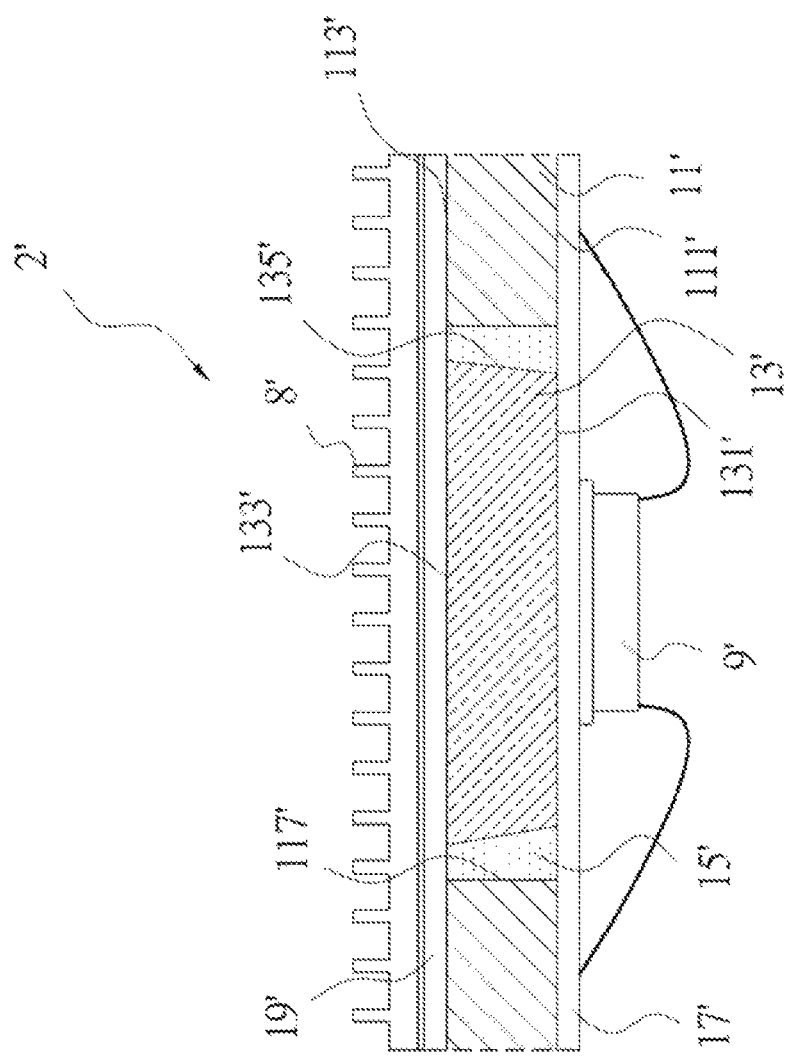

PRINTED CIRCUIT BOARD WITH BUILT-IN VERTICAL HEAT DISSIPATION CERAMIC BLOCK, AND ELECTRICAL ASSEMBLY COMPRISING THE BOARD

FIELD OF THE INVENTION

The present invention relates to a printed circuit board and, more particularly, to a printed circuit board with built-in vertical heat dissipation ceramic block, and an electrical assembly including the board.

BACKGROUND OF THE INVENTION

A printed circuit board (PCB) is a copper-clad substrate, which serves as a foundation for installing electronic components thereon. Generally, a copper-clad substrate includes at least one insulation layer made of a dielectric material, and a conductive layer made of copper foil and arranged on the insulation layer for forming traces (copper conductors). An insulation layer is mostly made of paper, bakelite, fiberglass, rubber, and other types of insulated material impregnated with resin. For convenience of description hereinafter, the insulation layer used in a copper-clad substrate is referred to as a dielectric material layer in the present invention.

With the increasingly complex and diverse circuit design requirements, printed circuit boards have evolved from a single-layer board and a double-layer board to a multi-layer board. Currently, multi-layer printed circuit boards include multiple layers of dielectric material and multiple layers of conductive material, so that more complicated and diversified circuits can be formed. The dielectric material layers may define a plurality of through holes, the walls of which can be plated with conductive material to be connected to traces of each layer, so that the board can be made smaller while accommodating more electronic components. FR-4, FR-5, FR-6 and FR-7, which are common substrates on the market, can be used as a core material for multi-layer PCBs.

As electronic devices continue to be miniaturized, some electronic components for special requirements are moving towards higher power. Under this condition, higher heat is prone to accumulate in smaller space. Also, there is a requirement for the spacing and width of traces to be reduced. For example, for a board made of bakelite or fiberglass, the distance between traces is reduced to about 50 micrometers (μm), and this makes the problem of high temperature worse due to heat accumulation on a circuit, which is difficult to deal with.

High-power components consume a large amount of electrical energy. This means they may have higher work efficiency, but it is inevitable that a certain percentage of energy is converted into heat energy. Furthermore, electronic technology is moving towards the complexity and diversification of electronic circuit design and layout. When high-power electronic components are placed on a printed circuit board, it means that more energy-consuming components will work on an identical or even smaller space. Under this trend, the heat problem will be more difficult to deal with than ever. Since the insulation layer of a copper-clad substrate of a general printed circuit board is mostly made of a dielectric material, which is not a good thermal conductor, the thermal energy generated by a high heating element is accumulated close to the element, and this makes the operation environment of the board unsatisfactory. Furthermore, too much heat accumulation usually leads to the expansion of a printed circuit board. However, the thermal expansion coefficient of a printed circuit board is different from those of the electronic components. As a result, the board can be damaged due to thermal stress.

Currently, in order to improve the heat dissipation efficiency, there are two commonly used methods. One method is thermal convection or radiation, which allows the thermal energy generated by the electronic components of a printed circuit board to spread out to the ambient environment around the board. However, the thermal dissipation efficiency of this method is low. Another method employs a metal wire or heat sink, which has good thermal conductivity. Although this method has a better effect on thermal dissipation than a board which dissipates heat only via its dielectric material, the thermal dissipation efficiency is not high due to the diameter of the metal wire or the dimension of the heat sink being not adequate. On the other hand, a heat sink is usually attached to a printed circuit board via a thermal conductive adhesive, which has a thermal-conductive coefficient far less than a metal. Even a cooling fan is installed at one side of a heat sink remote from the electronic components, the thermal dissipation effect is compromised.

A third method is adding a heat pipe. However, it occupies large space and is complicated in structure. Thus, the manufacturing cost may be increased significantly. Other methods involve modifying the material or structure of a printed circuit board. For example, aluminum has thermal conductivity of about 237 W/m/K and can be used as a metal core of a printed circuit board (known as Metal Core PCB or MCPCB). However, due to technical reasons, this method is not yet to be used for making a multi-layer board. This method is not suitable for a complicated circuit design. Furthermore, this method may cause layout deformation on a board during a manufacturing process, and thus cannot be used widely.

Currently, the commonly adopted solution is to use a ceramic material as an insulation layer of a printed circuit board. The most commonly used ceramic material is aluminum oxide ($Al_2O_3$), which can be used on a DBC (direct bonded copper) board, wherein the thermal conductivity of single-crystal aluminum oxide can reach 35 W/m/K; the thermal conductivity of poly-crystal aluminum oxide ranges from 20 to 27 W/m/K. Other commonly used ceramic materials include: aluminum nitride (AlN), beryllium oxide (BeO), and silicon carbide (SiC). Since the above-mentioned ceramic materials with good thermal conductivity are commonly used in circuit boards accommodating high-power electronic components, such boards are sometimes referred to as high-power electronic substrates or boards.

In practice, if a printed circuit board made of a ceramic material is to be used, the width of the traces can be as small as 30 micrometers (μm). However, the ceramic board is usually manufactured under high temperature, a small amount of uneven expansion or bending may occur, so that the ceramic boards are not as good as general printed circuit boards in precision and not suitable to be manufactured as multi-layer boards. On the other hand, metal atoms constituting the circuit are easily diffused during the high temperature process, so that the distance between the traces must be maintained at about 80 micrometers (μm). Therefore, in addition to an increased cost, the distance between the traces cannot be reduced, and the traces cannot be formed at precise location, so that an electronic device employing a whole-piece ceramic board cannot be miniaturized.

Therefore, for a high heat-generating electronic component, the component is often arranged on a small ceramic piece to form a package, and then the package can be provided on a resin-type printed circuit board to form a stacked structure. However, this may increase the volume of the board. Besides, there exists a material of poor thermal conductivity between the ceramic piece and a heat conducting element, the originally asserted thermal dissipation efficiency can be compromised.

Some manufacturer has proposed a semiconductor process to deposit heat-dissipating materials on an etched dielectric substrate to form a composite heat-dissipating substrate, as shown in FIG. 1. However, the equipment for conducting the semiconductor process is expensive, and this raises the cost of a printed circuit board, wherein a mask apparatus accounts for a large proportion of the cost. Therefore, this method is not suitable for products which are diversified and made in small quantity. Since this method is subjected to considerable limitations, it is not accepted by general board makers.

Therefore, the present invention intends to provide a printed circuit board, which allows the width and spacing of the traces of a circuit to be small compared to conventional boards, so that circuit designs can be miniaturized, the thermal dissipation efficiency can be increased to be suitable for an application requiring high-power electronic components and suitable for products which are diversified and made in small quantity to provide flexibility in manufacturing to meet the requirements of different customers.

SUMMARY OF THE INVENTION

A first object of the present invention is to provide a printed circuit board with a built-in vertical heat dissipation ceramic block, which allows at least one portion, where a high-power component is located, to conduct heat effectively, and allows the other portions to be implemented with circuit designs flexibly.

A second object of the present invention is to provide a printed circuit board with a built-in vertical heat dissipation ceramic block, which contains one or more heat dissipation zones capable of being flexibly arranged to facilitate circuit layouts for products which are diversified and made in small quantity.

A third object of the present invention is to provide a printed circuit board with a built-in vertical heat dissipation ceramic block, wherein the ceramic block is disposed vertically in the board to form an effective thermal conduction path.

A fourth object of the present invention is to provide a printed circuit board with a built-in vertical heat dissipation ceramic block, wherein the ceramic block is located in a through hole of the board, and a thermal dissipation device is provided on a lower surface of the board.

A fifth object of the present invention is to provide a printed circuit board with a built-in vertical heat dissipation ceramic block, which is more economical than conventional boards made of whole-piece ceramic substrates.

A sixth object of the present invention is to provide a printed circuit board with a built-in vertical heat dissipation ceramic block, wherein a metal circuit is provided on two flush upper surfaces of a dielectric material layer and a ceramic block to form an integral board, which is simple in structure and low in cost.

To achieve the above objects, the printed circuit board of the present invention comprises a dielectric material layer, at least one ceramic block, at least one fixing portion, a metal circuit layer, and a high thermal conductivity layer. The dielectric material layer has a first upper surface and a first lower surface opposite to the first upper surface, and defines at least a through hole extending through the first upper and lower surfaces. The ceramic block is located in the through hole of the dielectric material layer, wherein the ceramic block has a second upper surface and a second lower surface, and the ceramic block has thermal conductivity greater than the dielectric material layer. The fixing portion is disposed around the ceramic block located in the through hole for joining the ceramic block and the dielectric material layer, such that the second upper surface of the ceramic block is flush with the first upper surface of the dielectric material layer, and the second lower surface of the ceramic block is flush with the first lower surface of the dielectric material layer. The metal circuit layer is provided on the first upper surface and the second upper surface. The high thermal conductivity layer has thermal conductivity greater than the ceramic block and is provided on the first lower surface and the second lower surface.

After electronic components have been installed on the printed circuit board, an electrical assembly can be constructed, which generally comprises a printed circuit board, and a plurality of electronic components. The circuit board includes a dielectric material layer, at least one ceramic block, at least one fixing portion, a metal circuit layer, and a high thermal conductivity layer. The dielectric material layer has a first upper surface and a first lower surface opposite to the first upper surface, and defines at least a through hole extending through the first upper and lower surfaces. The ceramic block is located in the through hole of the dielectric material layer, wherein the ceramic block has a second upper surface and a second lower surface, and the ceramic block has thermal conductivity greater than the dielectric material layer. The fixing portion is disposed around the ceramic block located in the through hole for joining the ceramic block and the dielectric material layer, such that the second upper surface of the ceramic block is flush with the first upper surface of the dielectric material layer, and the second lower surface of the ceramic block is flush with the first lower surface of the dielectric material layer. The metal circuit layer is provided on the first upper surface and the second upper surface. The high thermal conductivity layer has thermal conductivity greater than the ceramic block and is provided on the first lower surface and the second lower surface. The electronic components are provided on the metal circuit layer and include at least one high power component located on a portion of the metal circuit layer corresponding to the second upper surface of the ceramic block.

The present invention can reduce the size of a ceramic material used in a printed circuit board, thus reducing the manufacturing cost, and retaining the advantages of good thermal conductivity of the ceramic material and allowing the printed circuit board to be implemented with complicated circuit designs. Not only does the printed circuit board meet the trend of circuit miniaturization, but the board provides good thermal conduction for high power components so that the operating environment of the printed circuit board can be maintained at a proper temperature. Furthermore, the present invention can control the thermal conduction path more effectively to ensure good operation of other electronic components. Particularly, the printed circuit board allows products to be diversified and made in small quantity, thus increasing the flexibility of use of the printed circuit board.

BRIEF DESCRIPTION OF THE DRAWINGS

FIG. 6 shows a schematic sectional view of a printed circuit board and an electrical assembly based on the board according to a second embodiment of the present invention, wherein the electrical assembly includes a high power LED.

The foregoing and other features and advantages of illustrated embodiments of the present invention will be more readily apparent from the following detailed description, which proceeds with reference to the accompanying drawings.

DETAILED DESCRIPTION OF THE ILLUSTRATED EMBODIMENTS

The foregoing and other technical contents, features and advantages of the present invention will be illustrated in detail by way of exemplary embodiments with reference to the accompanying drawings. In the exemplary embodiments, same elements will be indicated by similar numerals or labels.

Figure 1:
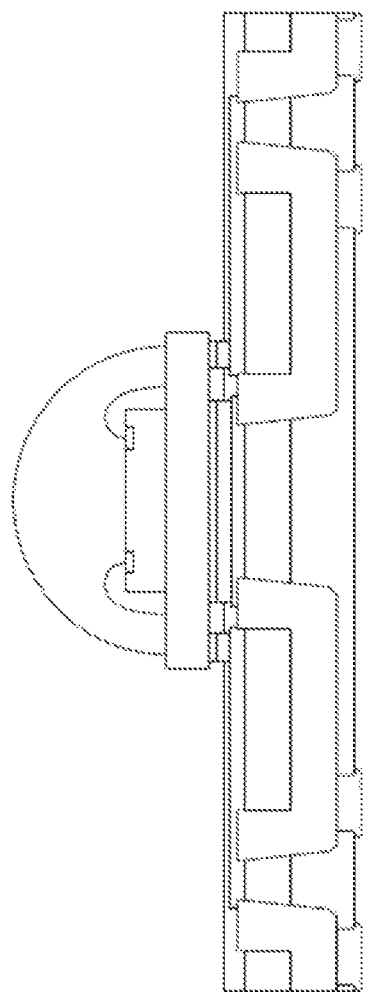
FIG. 1 shows a schematic side view of a prior art, wherein a printed circuit board and an electrical assembly are illustrated.
Figure 2:
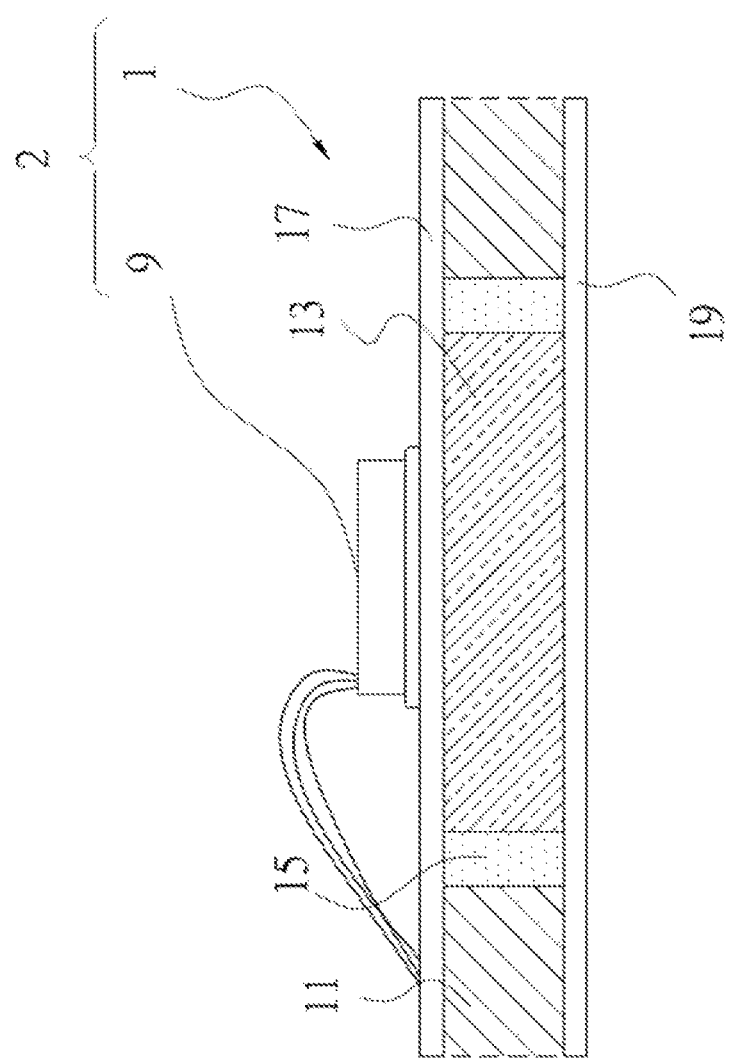
FIG. 2 shows a schematic sectional view of a printed circuit board and an electrical assembly based on the board according to a first embodiment of the present invention, wherein a ceramic block is embedded in the board, and an integral structure of the electrical assembly is illustrated.
Figure 3:
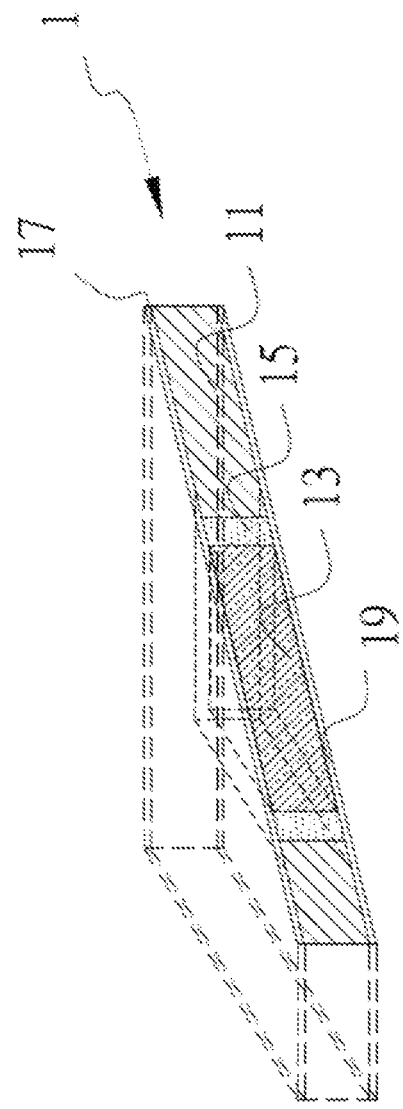
FIG. 3 shows a 3-dimensional sectional view of the printed circuit board, wherein the internal structure of the printed circuit board is illustrated.
Figure 4:
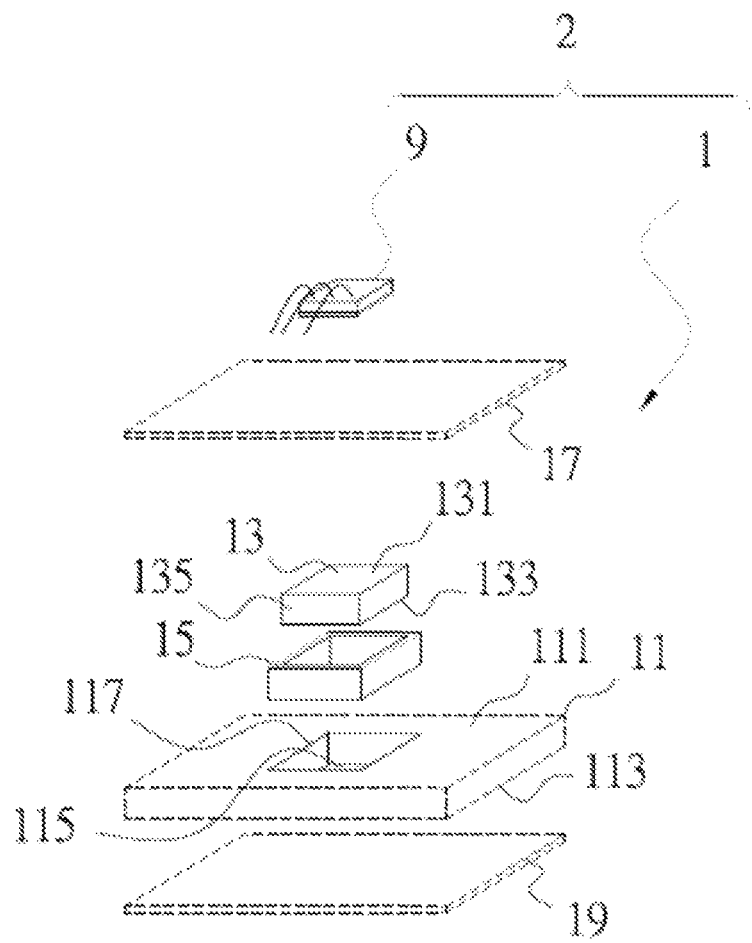
FIG. 4 shows an exploded view of the printed circuit board and the electrical assembly.
Figure 5:
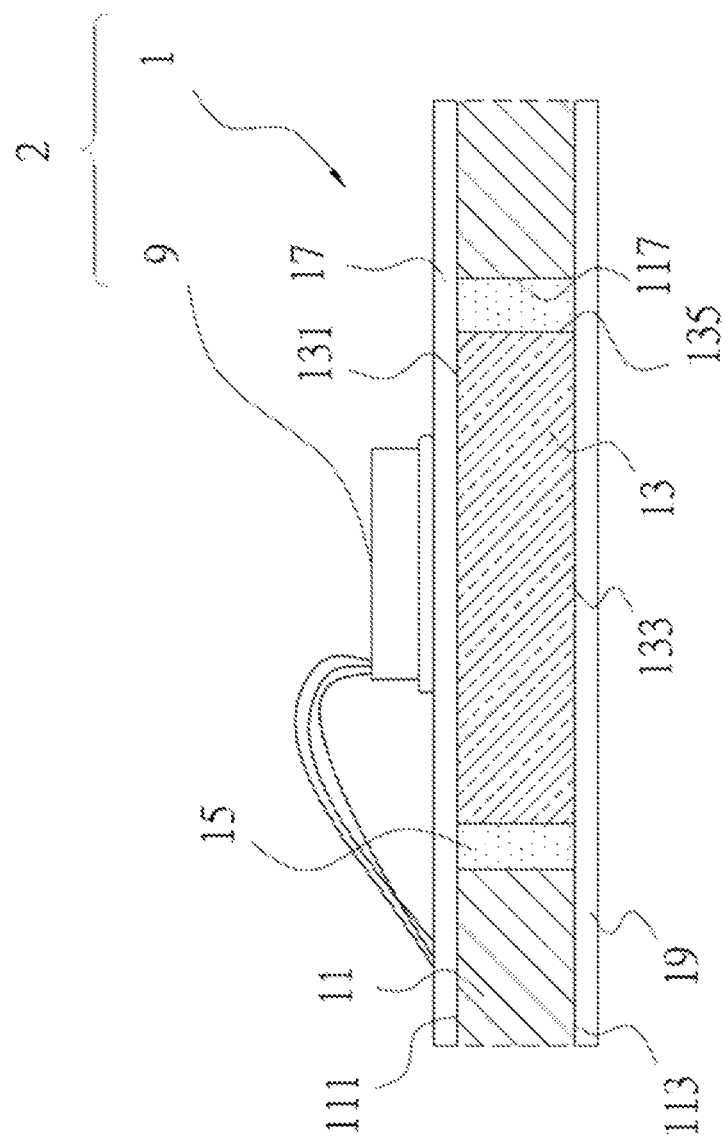
FIG. 5 shows a schematic sectional view of the electrical assembly, which includes an IGBT (insulated gate bipolar transistor).

Referring to FIGS. 2 through 5, a printed circuit board 1 with a built-in vertical heat dissipation ceramic block 13 and an electrical assembly 2 according to a first embodiment of the present invention is shown. The printed circuit board 1 includes a dielectric material layer 11, which can be obtained from a multi-layered FR-4 substrate (10 cm in both length and width). The dielectric material layer 11 defines a rectangular through hole 115 (2 cm in both length and width), which can be cut thorough laser technology. A cubic heat dissipation ceramic block 13, made of aluminum oxide (Al2O3), can be inserted in the through hole 115. However, those skilled in the art can easily understand that the size of the FR-4 substrate ranging from 10 to 3600 square centimeters can also be used for the printed circuit board.

For ease of description, one surface of the dielectric material layer 11, which faces upwardly as can be seen in the drawings, is referred to as a first upper surface 111; an opposite surface of the dielectric material layer 11, which faces downwardly, is referred to as a first lower surface 113; one surface of the ceramic block 13, which faces upwardly as can be seen in the drawings, is referred to as a second upper surface 131; an opposite surface of the ceramic block 13, which faces downwardly, is referred to as a second lower surface 133. The thickness of the dielectric material layer 11 is approximately equal to the thickness of the heat dissipation ceramic block 13. Of course, those skilled in the art can easily understand that the dielectric layer 11 can also be implemented by pre-pregs formed of epoxy resin or fiberglass, such as FR-1 (commonly known as bakelite), FR-3, FR-6, and G-10. The through hole 115 can be defined by a mechanical cutting method or the like. Other materials, such as silicon nitride (Si3N4), silicon carbide (SiC), or beryllium oxide (BeO), can be used instead of aluminum oxide (Al2O3) to make the heat dissipation ceramic block 13.

The gap between the outer surface 135 of the ceramic block 13 and the inner surface 117 of the through hole 115 can be filled with an epoxy adhesive. The outer surface 135 of the ceramic block 13 can be joined to the inner surface 117 of the through hole 115 after the adhesive is cured, wherein the adhesive serves as a fixing portion 15, which has flexibility greater than the ceramic block 13. The fixing portion 15 is a mechanical buffer mixed material, which can provide buffer protection between two materials which have different thermal expansion coefficients. Of course, those skilled in the art can easily understand that silicone-based or other flexible adhesives can be used instead of the epoxy adhesive.

After the heat dissipation ceramic block 13 has been fixedly embedded in the through hole 115 of the dielectric material layer 11, the two combined members can be polished such that the first upper surface 111 is flush with the second upper surface 131. The first and second upper surfaces 111, 131 can be sequentially sputtered with titanium and copper layers to form a barrier layer and a seed layer. Next, the seed layer can be thickened by using an electroplating process to form a copper layer. Furthermore, additional nickel and gold layers can be added to the copper layer to form a multi-layer metal, so that the copper layer can be protected from easy oxidation. Of course, those skilled in the art can easily understand that the copper layer can be protected by other materials, such as organic solderability preservatives (OSP), silver, and tin, without compromising implementation of the present invention. The multi-layer metal can be patterned with a series of routine processes to form a metal circuit layer 17. Of course, those skilled in the art can understand that other methods, such as evaporation, can be adopted, and/or other metals can be used instead to form a metal circuit layer.

A copper metal sheet, which has greater thermal conductivity (380 W/m/K) than the ceramic block 13, is provided on the first lower surface 113 and the second lower surface 133, which are at the same level, to form a high thermal conductivity layer 19. The high thermal conductivity layer 19, which is placed in contact with the dielectric material layer 11 and the heat dissipation ceramic block 13, has thermal conductivity greater than the dielectric material layer 11 and the ceramic block 13. The thermal dissipation coefficients of the ceramic block 13 and the high thermal conductivity layer 19 are much higher than that of the dielectric material layer 11, so that the high thermal conductivity layer 19 allows the thermal energy directed by the ceramic block 13 to spread out horizontally to be released into the environment. On the other hand, ordinary electronic components (not shown) disposed above the dielectric material layer 11 are not easily affected by the thermal energy directed by the ceramic block 13. As a result, the thermal energy generated by the high power component 9 can be isolated from the ordinary electronic components.

After the printed circuit board 1 is constructed, a plurality of electronic components, including at least one high power component 9, can be installed on the board. In this embodiment, the high power component 9 is illustrated as an IGBT (insulated gate bipolar transistor), which can be soldered by SMT (surface-mount technology) on pads of the metal circuit layer 17 above the ceramic block 13, wherein some terminals of the IGBT can be connected by metal wires to corresponding pads of the metal circuit layer 17 on the board. Because IGBT has the advantages of high efficiency and fast switching speed, it is often used in electrical devices requiring a large amount of work, such as air conditioners, refrigerators, audios, and motor drives. When the electrical devices operate, IGBTs will generate a large amount of thermal energy, which may be directed to pass through the ceramic block 13 made of aluminum oxide (Al2O3), down to the high thermal conductivity layer 19, which has a large area to facilitate thermal dissipation. In addition, an active fan and/or a water cooling system (not shown) can be used to enhance the effect of thermal dissipation efficiency.

Of course, those skilled in the art can easily understand that a radiating fin (not shown) can be attached to the high thermal conductivity layer 19. Since ordinary electronic components, excluding the high power component 9, are mounted on the metal circuit layer 17 at a distance from the ceramic block 13, and the dielectric material layer 11 has a relatively low thermal-conductive coefficient, the ordinary electronic components are not easily affected by the thermal energy generated by the high power component 9. As such, the heat dissipation ceramic block 13 transfers thermal energy vertically at a high speed, but is difficult to transfer thermal energy to the dielectric material layer 11 so that the ordinary electronic components can function normally. The high power component 9 mounted on the built-in vertical heat-dissipation ceramic block 13 of the printed circuit board 1 allows the electrical assembly 2 to achieve the so-called effect of thermoelectric separation. Under these circumstances, the components that do not generate high thermal energy can be located on a printed circuit board and operated at a low-temperature working environment, so that the printed circuit board allows complicated circuit designs and can be miniaturized.

A second embodiment of the present invention is shown in FIG. 6, wherein an electrical assembly 2' can be mounted on a street light pole for illumination. In this embodiment, the high power component 9' is illustrated as a high power LED. Since many structural features of this embodiment are same as those of the first embodiment, detailed description for those features is omitted here. In this embodiment, the dielectric material layer 11' is a flexible substrate having a size of about 100 square centimeters; the heat dissipation ceramic block 13' has a size between 0.01 to 25 square centimeters. However, those skilled in the art can easily understand that the flexible substrate may have a size between 5 to 3600 square centimeters, provided that the size of the flexible substrate is greater than that of the ceramic block.

In this embodiment, the heat dissipation ceramic block 13' is made of aluminum nitride (AlN). After the ceramic block 13' is firmly embedded in the flexible substrate, one or more high power LEDs can be respectively mounted on one or more heat dissipation ceramic blocks 13'. The LED driving circuit unit can be disposed above the first upper surface 111' of the dielectric material layer 11'. Since the printed circuit board is based on a flexible substrate, so the board can be installed in compliance with the environment. Similarly, the heat dissipation ceramic block 13' can be disposed in compliance with the flexible dielectric material layer 11'. In this embodiment, the outer surface 135' of the ceramic block 13', which is a non-minimal surface with a wider bottom and not perpendicular to the second upper surface 131' and the second lower surface 133' of the ceramic block 13', corresponds to the inner surface 117' of the through hole (not labeled), which is a non-minimal surface and not perpendicular to the first upper surface 111' and the first lower surface 113' of the dielectric material layer 11'. This feature facilitates the ceramic block 13' being firmly embedded in the dielectric material layer 11'.

In this embodiment, the fixing portion 15' between the dielectric material layer 11' and the heat dissipation ceramic block 13' is a thermal-conductive silicone; however, other materials, such as graphite, phase-change material and the like, which have higher thermal conductivity than the dielectric material layer 11', can also be used. In addition to the thermal-conductive fixing portion 15' capable of assisting heat transfer, a finned heat-dissipation block 8' can be attached to the high thermal conductivity layer 19' via the thermal-conductive silicone. Of course, a locking device, such as bolts, can be installed at the high thermal conductivity layer 19' to enhance the combination of the dielectric material layer 11' and the heat dissipation ceramic block 13', so that air gaps are not easy to form between the dielectric material layer 11' and the ceramic block 13'. In addition, heat pipes or graphene products may be provided at the high thermal conductivity layer 19' to further increase the heat dissipation effect.

In the circuit assembly 2' of the present invention, the heat dissipation ceramic block 13' is firmly embedded in the dielectric material layer 11' such that the first upper surface 111' is flush with the second upper surface 131', and the first lower surface 113' is flush with the second lower surface 133'. Furthermore, the metal circuit layer 17' is provided on the first upper surface 111' and the second upper surface 131'; the high thermal conductivity layer 19' is provided on the first lower surface 113' and the second lower surface 133'. The high thermal conductivity layer 19' has thermal conductivity greater than the heat dissipation ceramic block 13', so that most of the thermal energy generated by the high power component 9' is directed to pass through the heat dissipation ceramic block 13' to enter the high thermal conductivity layer 19', via which the thermal energy is transferred to the environment. Thus, other electronic components (not shown) disposed above the dielectric material layer 11' are less likely to be disturbed by the thermal energy of the high power component 9', thus achieving the effect of thermoelectric separation. In addition, since it is not necessary to use a high-cost substrate made of a whole-piece ceramic material, the printed circuit board can be made more economically. The combination of the ceramic block 13' and the dielectric material layer 11' is simple, which facilitates manufacturing and allows products to be diversified and made in a small amount. Of course, the heat dissipation ceramic block is not limited to a columnar or square object. Also, the ceramic block can be configured to have a U-shaped cross-section without compromising the performance of heat dissipation. The ceramic block in cooperation with, but not limited to, the technically matured resin-type substrate allows multi-layer circuit designs to be implemented, so that complicated and miniaturized boards can be made without use of semiconductor equipment. Thus, the product cost can be greatly reduced and the objects of the present invention can be achieved effectively.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the scope of the invention.

What is claimed is:
1. A printed circuit board, comprising:
    a dielectric material layer, which has a first upper surface and a first lower surface opposite to the first upper surface, and defines at least a through hole extending through the first upper and lower surfaces;

at least one ceramic block located in the through hole of the dielectric material layer, the ceramic block having a second upper surface and a second lower surface, the ceramic block having thermal conductivity greater than the dielectric material layer;

at least one fixing portion disposed around the ceramic block located in the through hole for joining the ceramic block and the dielectric material layer, such that the second upper surface of the ceramic block is flush with the first upper surface of the dielectric material layer, and the second lower surface of the ceramic block is flush with the first lower surface of the dielectric material layer;

a metal circuit layer provided on the first upper surface and the second upper surface; and a high thermal conductivity layer having thermal conductivity greater than the ceramic block and provided on the first lower surface and the second lower surface.

2. The printed circuit board of claim 1, wherein the dielectric material layer has an area ranging from 5 to 3600 square centimeters; the ceramic block has an area ranging from 0.01 to 25 square centimeters.

3. The printed circuit board of claim 1, wherein the dielectric material layer has an inner surface, which defines the through hole, between the first upper surface and the first lower surface thereof, and the ceramic block has an outer surface formed between the second upper surface and the second lower surface thereof, the fixing portion being disposed between the inner surface of the dielectric material layer and the outer surface of the ceramic block to join the dielectric material layer and the ceramic block together.

4. The printed circuit board of claim 3, wherein the fixing portion is formed of a mechanical buffer mixed material which has flexibility greater than the ceramic block.

5. The printed circuit board of claim 1, wherein at least one portion of the outer surface of the ceramic block and/or the inner surface of the dielectric material layer is a non-minimal surface that is not perpendicular to the first upper surface, the first lower surface, the second upper surface, and the second lower surface.

6. An electrical assembly, comprising:
a printed circuit board, including:
a dielectric material layer, which has a first upper surface and a first lower surface opposite to the first upper surface, and defines at least a through hole extending through the first upper and lower surfaces;

at least one ceramic block located in the through hole of the dielectric material layer, the ceramic block having a second upper surface and a second lower surface, the ceramic block having thermal conductivity greater than the dielectric material layer;

at least one fixing portion disposed around the ceramic block located in the through hole for joining the ceramic block and the dielectric material layer, such that the second upper surface of the ceramic block is flush with the first upper surface of the dielectric material layer, and the second lower surface of the ceramic block is flush with the first lower surface of the dielectric material layer;

a metal circuit layer provided on the first upper surface and the second upper surface; and a high thermal conductivity layer having thermal conductivity greater than the ceramic block and provided on the first lower surface and the second lower surface; and a plurality of electronic components provided on the metal circuit layer and including at least one high power component located on a portion of the metal circuit layer corresponding to the second upper surface of the ceramic block.

7. The electrical assembly of claim 6, wherein the second upper surface of the ceramic block is greater than a lower surface of the high power component.

* * * * *